(12) United States Patent
Muscha

(10) Patent No.: US 8,319,551 B2
(45) Date of Patent: Nov. 27, 2012

(54) METHOD AND SYSTEM FOR IMPROVING LIMITING AMPLIFIER PHASE NOISE FOR LOW SLEW-RATE INPUT SIGNALS

(75) Inventor: Leslie Catherine Muscha, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 94 days.

(21) Appl. No.: 12/913,293

(22) Filed: Oct. 27, 2010

(65) Prior Publication Data

US 2011/0121900 A1 May 26, 2011

Related U.S. Application Data

(60) Provisional application No. 61/261,481, filed on Nov. 16, 2009.

(51) Int. Cl.
*H03F 3/45* (2006.01)
(52) U.S. Cl. .......................................... 330/252
(58) Field of Classification Search ........... 330/252–261
See application file for complete search history.

(56) References Cited

U.S. PATENT DOCUMENTS

| | | | |
|---|---|---|---|
| 5,802,464 A * | 9/1998 | Ashida ........................ | 455/339 |
| 6,624,699 B2 * | 9/2003 | Yin et al. ..................... | 330/260 |
| 7,019,592 B2 * | 3/2006 | Jaussi ........................ | 330/254 |
| 2004/0104746 A1 | 6/2004 | Kim et al. | |
| 2008/0074195 A1 | 3/2008 | Iyer | |

FOREIGN PATENT DOCUMENTS

| | | |
|---|---|---|
| EP | 0 954 093 A1 | 11/1999 |
| EP | 1 223 668 A2 | 7/2002 |

OTHER PUBLICATIONS

T. Tsukahara et al., "A 2GHz 60dB Dynamic-Range Si Logarithmic/Limiting Amplifier with Low-Phase Deviations," IEEE International Solid-State Circuits Conference, Digest of Technical Papers Feb. 6-8, 1997, ISSCC97/Session5/Communication Building Blocks/Paper TP 5.3.

F. O'Mahony et al., "Design of a 10GHz Clock Distribution Network Using Coupled Standing-Wave Oscillators," Proceedings of the 40 Annual Design Automation Conference, Jun. 2-6, 2003.

European Search Report issued in European Patent Application No. EP 10014625.7 dated Mar. 3, 2011.

* cited by examiner

*Primary Examiner* — Robert Pascal
*Assistant Examiner* — Khiem Nguyen
(74) *Attorney, Agent, or Firm* — McDermott Will & Emery LLP

(57) ABSTRACT

Apparatus and method for a limiting amplifier with improved phase noise. The improved limiting amplifier includes an input port, an output port, and one or more cascaded gain stages. The input of a first gain stage is connected to the input port of the limiting amplifier. The output of a last gain stage is connected to the output port of the limiting amplifier. Among the cascaded gain stages, an output of each gain stage is connected to an input of an adjacent gain stage. Each gain stage i, $1 < i < n-1$, is configured so that it is capable of selecting at least one lowpass filter corner frequency $\omega_{p_i}$, and thereby reducing the phase noise of the gain stage through the broadband noise reduction for frequencies greater than $\omega_{p_i}$. Here, $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage.

13 Claims, 9 Drawing Sheets

METHOD AND SYSTEM FOR IMPROVING LIMITING AMPLIFIER PHASE NOISE FOR LOW SLEW-RATE INPUT SIGNALS

RELATED APPLICATION

The present invention claims priority of provisional patent application No. 61/261,481 filed Nov. 16, 2009, the contents of which are incorporated herein in their entirety.

BACKGROUND

1. Technical Field

The present teaching relates to method and system for analog circuits. More specifically, the present teaching relates to method and system for limiting amplifiers and systems incorporating the same.

2. Discussion of Technical Background

Modern high-performance communication systems increasingly rely on precision clocks for data conversion. Clocks used to drive analog-to-digital converters (ADC's) sample the analog input signal, where any imperfections in the sampling timing will result in imperfections in the output data. Such imperfections can be characterized by degradation of the ADC signal-to-noise ratio (SNR), where it is known that the SNR degradation due to clock imperfections is proportional to both clock jitter and the analog input frequency. It is commonly known that this SNR degradation is indistinguishable from SNR degradation caused by quantization noise or other noise present on the analog input signal.

As digital processing capability continues to improve, it has become popular to digitize signals earlier and earlier in the signal chain, hence at ever higher frequencies. For example, both direct-IF and even direct-RF receivers have become common. In these applications, an ADC is actually under-sampled. Under-sampling takes advantage of the fact that as long as the sampling occurs at the Nyquist frequency of the bandwidth of interest or above, the modulated signal can be recovered. Therefore, an analog input signal can actually be sampled at a frequency much lower than its carrier frequency, and the sampled data still retains the modulated content of interest.

However, under-sampling places stringent requirements on the clock used for the sampling. As noted above, the SNR degradation due to jitter is dependent on both clock jitter and analog input frequency. In an under-sampled ADC, the clock will still be sampling a signal with the high slew-rates of the analog carrier input. So, as the analog input frequency increases, often a significant limitation to the SNR performance is clock jitter.

Both clock jitter and phase noise are measures of clock variation. Phase noise is defined as the power spectral density of the phase variation of a signal. Thus, it is a frequency domain quantity. Integration of the phase noise over a specified offset frequency bandwidth converts it to a time-domain quantity, or aperture jitter, which is considered to be the variations of the clock zero-crossings relative to the zero-crossings of an ideal clock. Although there are other jitter metrics that reflect period variations and adjacent cycle variations of a clock, the most descriptive measure of clock variation is phase noise, because no offset frequency specific information is lost.

A complication in designing low phase noise clocking systems is the issue of frequency aliasing. In sampled data systems such as ADC's, aliasing of the clock spectrum will occur for frequency content beyond the sampling frequency. As noted by W. Egan in the paper "Modeling Phase Noise in Frequency Dividers," IEEE Transactions on Ultrasonics, Ferroelectrics and Frequency Control, Volume 37, Issue 4, July 1990, pages 310-311, a similar issue occurs for frequency dividers used in synthesizer applications. In both situations, large bandwidths in a clock path can result in degraded phase noise due to noise folding into the baseband. For this reason, as is noted in the U.S. Pat. No. 7,345,528, "Method and Apparatus for Improved Clock Preamplifier with Low Jitter", columns 2-3, it is a common practice to design high performance communications systems with a bandpass filter following a low-noise sine-wave signal. Such a bandpass filter aims at reducing the out of band noise to minimize degradation in overall phase noise caused by spectral folding.

In most situations, the output of such a bandpass filter is followed by a limiting amplifier to "square up" the signal before it is used to sample data (in ADC applications) or clock a frequency divider (in frequency synthesizer applications). The "squaring-up" of the clock is done to minimize the region where sampler or divider noise adversely affects the output signal noise. As noted by C. Xu, et al. in "Analysis of Clock Buffer Phase Noise", $9^{th}$ International Conference on Electronics, Circuits and Systems, 2002, Volume 2, September 2002, pages 425-428, the output phase noise scaling factor for a clock amplifier is improved by ensuring fast, symmetrical rising and falling output signals. A similar observation can be made that conversion of voltage noise to timing jitter is proportional to the inverse of slew-rate. Therefore, having a high slew-rate clock signal is highly desirable.

It is often assumed that the output slew rate of an amplifier stage is determined by the charging of parasitic capacitors. While this is the case for a limiting amplifier driven by a high slew-rate signal, it is not the case when the limiting amplifier is driven by a slow sine wave or other low slew-rate input. Thus, it is a challenge for a limiting amplifier to achieve low phase noise when it is presented with a low slew-rate input, especially because a limiting amplifier is usually designed to operate over a wide range of input slew-rates.

A typical limiting amplifier includes a series of cascaded gain stages 120, 130, . . . , 140, 150 that take an input signal 110 and produce an output signal 160, as shown in FIG. 1 (Prior Art), which not only limit the signal amplitude, but also increase the output slew rate. A common configuration for a gain stage of a prior art limiting amplifier is a circuit 200 shown in FIG. 2 (Prior Art). In this circuit 200, there is a differential pair Q0 215 and Q1 225 as well as corresponding emitter followers 240 and 235, respectively. In such an implementation, bipolar devices are chosen based on their superior 1/f noise characteristics. However, large MOSFET devices may also be used. When a differential signal applied to the base inputs of the differential pair circuit, or nodes 205 IN+ and 210 IN−, has a high slew-rate, the output slew-rate is limited by the charging of parasitic capacitances, such as ITAIL charging parasitic capacitors at the outputs of the differential pair circuit, or nodes 225 DP+ and 215 DP−.

In this configuration, any increase in parasitic capacitance at critical nodes, e.g., nodes 225 DP+ and 215 DP−, will degrade the output slew rate. But in case of a low slew-rate input signal, the parasitic capacitances play less of a role in output slew-rate, which is primarily determined by the amplifier gain multiplied by the input slew-rate.

An important observation is that any circuit bandwidth beyond that which improves or maintains the output slew-rate will degrade the output phase noise because of the increasing effect of noise folding, as described earlier. Given such observations, it is desirable to limit the bandwidth when a low slew-rate input is applied to reduce the degradation in phase noise caused by excess bandwidth. This may be achieved by adding a filter to a limiting amplifier stage so that broadband noise can be reduced and output phase noise can be improved without affecting the output slew-rate. In fact, an optimal bandwidth reduction may actually result in a slight reduction of output slew rate. This is because, up to a point determined by circuit characteristics and operating conditions, the output noise reduction may outweigh the slew-rate reduction and actually result in superior phase noise.

U.S. Pat. No. 4,591,805, describes a method of implementing an adaptive bandwidth amplifier. An example adaptive bandwidth amplifier gain stage 300 is illustrated in FIG. 3 (Prior Art). Similar to the circuit shown in FIG. 2, circuit 300 includes a pair of differential bipolar transistors Q0 320 and Q1 330. The differential bipolar transistors receive differential input IN+ 305 and IN− 310 and produce, via their followers output OUT+ 370 and OUT− 375. Otherwise, in circuit 300, a capacitor 315 is introduced across the base-collector nodes of the bipolar transistor Q0 320 and another capacitor 325 is introduced across the base-collector nodes of the bipolar transistor Q1 330. With this construction, circuit 300 takes advantage of the Miller multiplication property, which results in an increased effective capacitance proportional to the gain. In addition to allowing small capacitors 315 and 325 (or $C_{CB}$) to achieve a specific bandwidth reduction, this prior art circuit 300 also allows adaptive bandwidth control as the input signal swing varies due to the gain dependence of the effective input capacitance.

One drawback of circuit 300 for filtering broadband noise is that, in addition to creating a dominant pole, this configuration also results in a zero at $g_m/C_{CB}$. Because of this zero, as frequency increases, the gain flattens until other poles take effect. Therefore, a single-pole filter at the same frequency as a dominant pole of circuit 300 is actually more effective for filtering broadband noise. Another observation is that inputs IN+ 305 and IN− 310 connecting to the bases of transistors Q0 320 and Q1 330, as shown in FIG. 3, likely are driven by a low impedance source, particularly in the context of a limiting amplifier as described earlier. In this case, the Miller multiplied effective capacitance at the base nodes of Q0 320 and Q1 330 likely will have less effect on circuit bandwidth than the effective capacitance at the collectors of Q0 320 and Q1 330, since the collector nodes will usually be higher impedance. Therefore, an improved approach for effective reduction of bandwidth is needed.

SUMMARY

The teachings disclosed herein related to methods and systems for improving limiting amplifier phase noise for low slew-rate input signals.

In one example, a limiting amplifier circuit with improved phase noise comprises an input port, an output port, and one or more cascaded gain stages, having an input of a first gain stage connected to the input port, an output of a last gain stage connected to the output port, and an output of each gain stage connected to an input of an adjacent gain stage. In this example, each gain stage i, 1<i<n−1, is configured so that it is capable of selecting at least one lowpass filter corner frequency $\omega_{p_i}$, and thereby reducing the phase noise of the gain stage through the broadband noise reduction for frequencies greater than $\omega_{p_i}$, and $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage.

In another example, a limiting amplifier circuit with improved phase noise comprises an input port, an output port, and one or more cascaded gain stages, having an input of a first gain stage connected to the input port, an output of a last gain stage connected to the output port, and an output of each gain stage connected to an input of an adjacent gain stage. In this example, each gain stage i, 1<i<n−1, is configured so that it is capable of selecting at least one lowpass filter corner frequency $\omega_{p_i}$, and thereby reducing the phase noise of the gain stage through the broadband noise reduction for frequencies greater than $\omega_{p_i}$, and $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage. Each gain stage comprises a differential input pair circuit having first and second transistors with their bases connected to differential positive and negative inputs, respectively, emitters connected to a first current source, and collectors coupled to a first power source via corresponding first and second resistors, an output circuit having third and fourth transistors with their emitters connected to second and third current sources, collectors connected to the first power source, and bases to the respective collectors of the first and second transistors, a first capacitor coupled in parallel to the first resistor, a second capacitor coupled in parallel to the second resistor, and a first set of switches to couple the first and second capacitors to the first and second resistors, respectively, when the bandwidth reduction sub-circuitry is enabled, and to decouple the first and second capacitors otherwise.

In a different example, a limiting amplifier circuit with improved phase noise comprises an input port, an output port, and one or more cascaded gain stages, having an input of a first gain stage connected to the input port, an output of a last gain stage connected to the output port, and an output of each gain stage connected to an input of an adjacent gain stage. In this example, each gain stage i, 1<i<n−1, is configured so that it is capable of selecting at least one lowpass filter corner frequency $\omega_{p_i}$, and thereby reducing the phase noise of the gain stage through the broadband noise reduction for frequencies greater than $\omega_{p_i}$, and $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage. Each gain stage comprises a differential input pair circuit having first and second transistors with their bases connected to differential positive and negative inputs, respectively, emitters connected to a first current source, and collectors coupled to a first power source via corresponding first and second resistors, an output circuit having third and fourth transistors with their emitters connected to second and third current sources, collectors connected to the first power source, and bases to the respective collectors of the first and second transistors, a first capacitor connecting the positive input and the second power source, a second capacitor connecting the negative input and the second power source, and a first set of switches to couple the first and second capacitors to the positive and negative inputs, respectively, when the bandwidth reduction sub-circuitry is enabled, and to decouple the first and second capacitors otherwise.

In another different example, a limiting amplifier circuit with improved phase noise comprises an input port, an output port, and one or more cascaded gain stages, having an input of a first gain stage connected to the input port, an output of a last gain stage connected to the output port, and an output of each gain stage connected to an input of an adjacent gain stage, with each gain stage i, 1<i<n−1, is configured so that it is capable of selecting at least one lowpass filter corner frequency $\omega_{p_i}$, and thereby reducing the phase noise of the gain stage through the broadband noise reduction for frequencies greater than $\omega_{p_i}$, and $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage. Each gain stage comprises a differential input pair circuit having first and second transistors with their bases connected to differential positive and negative inputs, respectively, emitters connected to a first current source, and collectors coupled to a first power source via corresponding first and second resistors, an output circuit having third and fourth transistors with their emitters connected to second and third current sources, collectors connected to the first power source, and bases to the respective collectors of the first and second transistors, a first capacitor connecting the base of the first transistor and the collector of the second transistor, a second capacitor connecting the base and collector of the first transistor, a third capacitor connecting the base of the second transistor and the collector of the first transistor, a fourth capacitor connecting the base and collector of the second transistor, and a first set of switches to couple the first, second, third and fourth capacitors to the appropriate base and collector junctions of the first and second transistors when the bandwidth reduction sub-circuitry is enabled, and to decouple them otherwise.

In yet another different example, a device incorporating a limiting amplifier with improved phase noise comprises one or more circuitries configured for performing corresponding one or more functions, at least one limiting amplifier, each of which is coupled with at least one of the circuitries, taking an input and producing an output. The limiting amplifier comprises an input port, an output port, and one or more cascaded gain stages, having an input of a first gain stage connected to the input port, an output of a last gain stage connected to the output port, and an output of each gain stage connected to an input of an adjacent gain stage. Each gain stage i, 1<i<n−1, is configured so that it is capable of selecting at least one low-pass filter corner frequency $\omega_{p_i}$, and thereby reducing the phase noise of the gain stage through the broadband noise reduction for frequencies greater than $\omega_{p_i}$, and $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

Apparatus and method for a limiting amplifier which has the ability to reduce the bandwidth at each different gain stage to improve the phase noise performance of the limiting amplifier when it is presented with a low slew-rate input. In addition, the present teaching incorporates selectable noise filtering at each gain stage of the limiting amplifier so that a specific bandwidth can be selected for that gain stage suitable for reducing broadband noise and hence output phase noise when inputs to the limiting amplifier are known to have a low slew-rate input.

Figure 3:
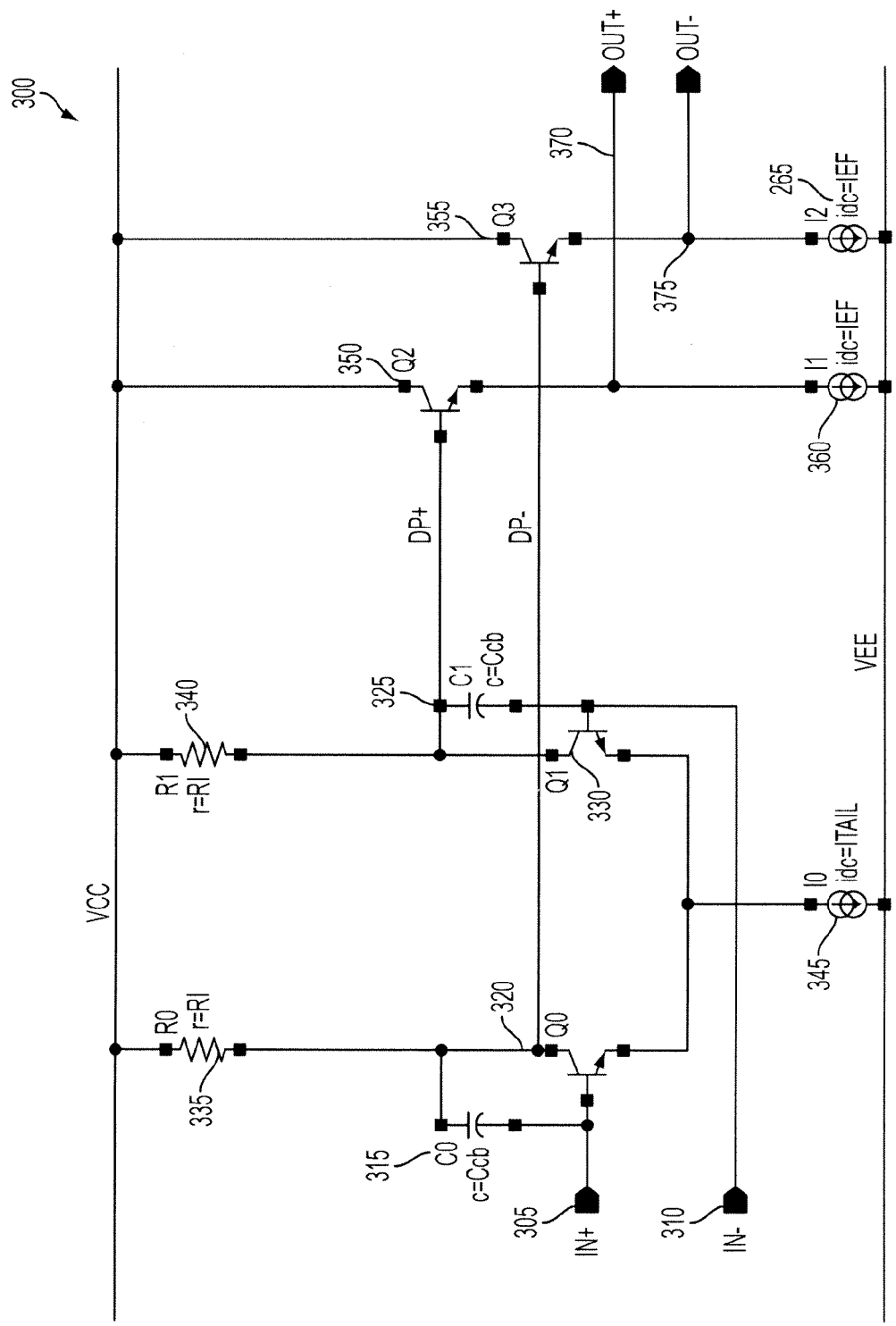
FIG. 3 (Prior Art) shows a gain stage circuit in a limiting amplifier with filter capacitors to reduce bandwidth.
Figure 4:
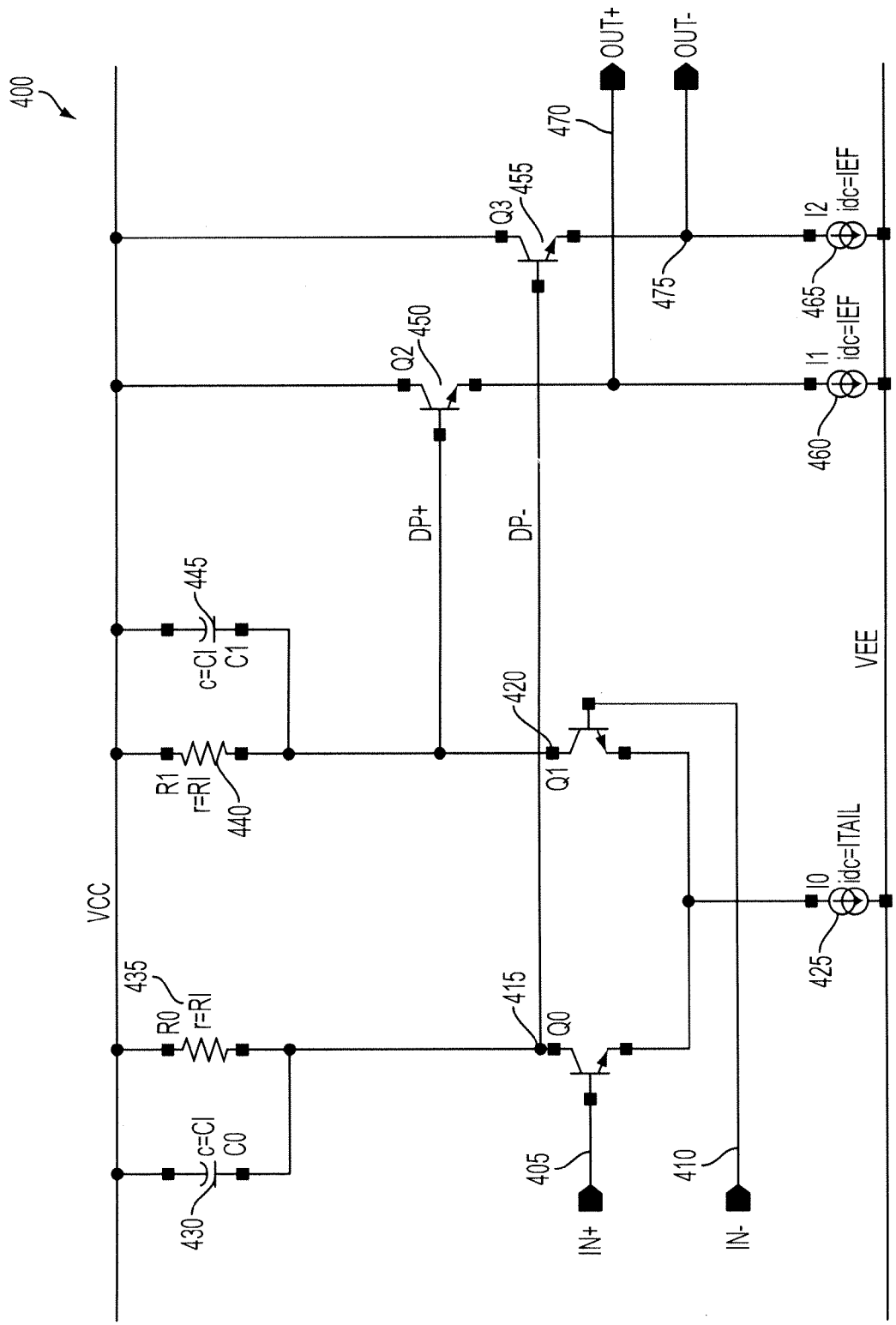
FIGS. 4-6 depict exemplary gain stage circuits in a limiting amplifier with filter capacitors to provide improved phase noise, according to an embodiment of the present teaching.
Figure 5:
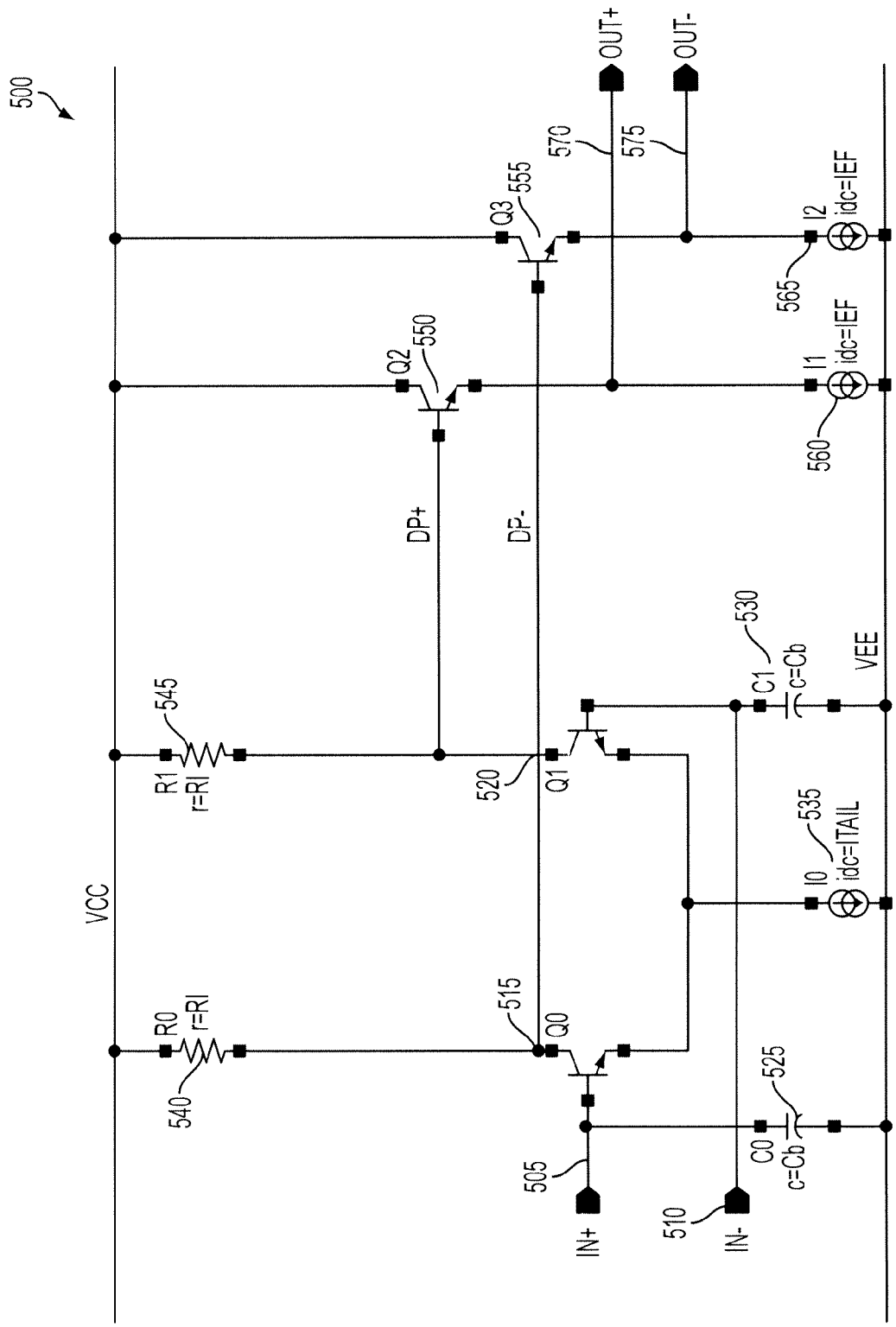
Figure 6:
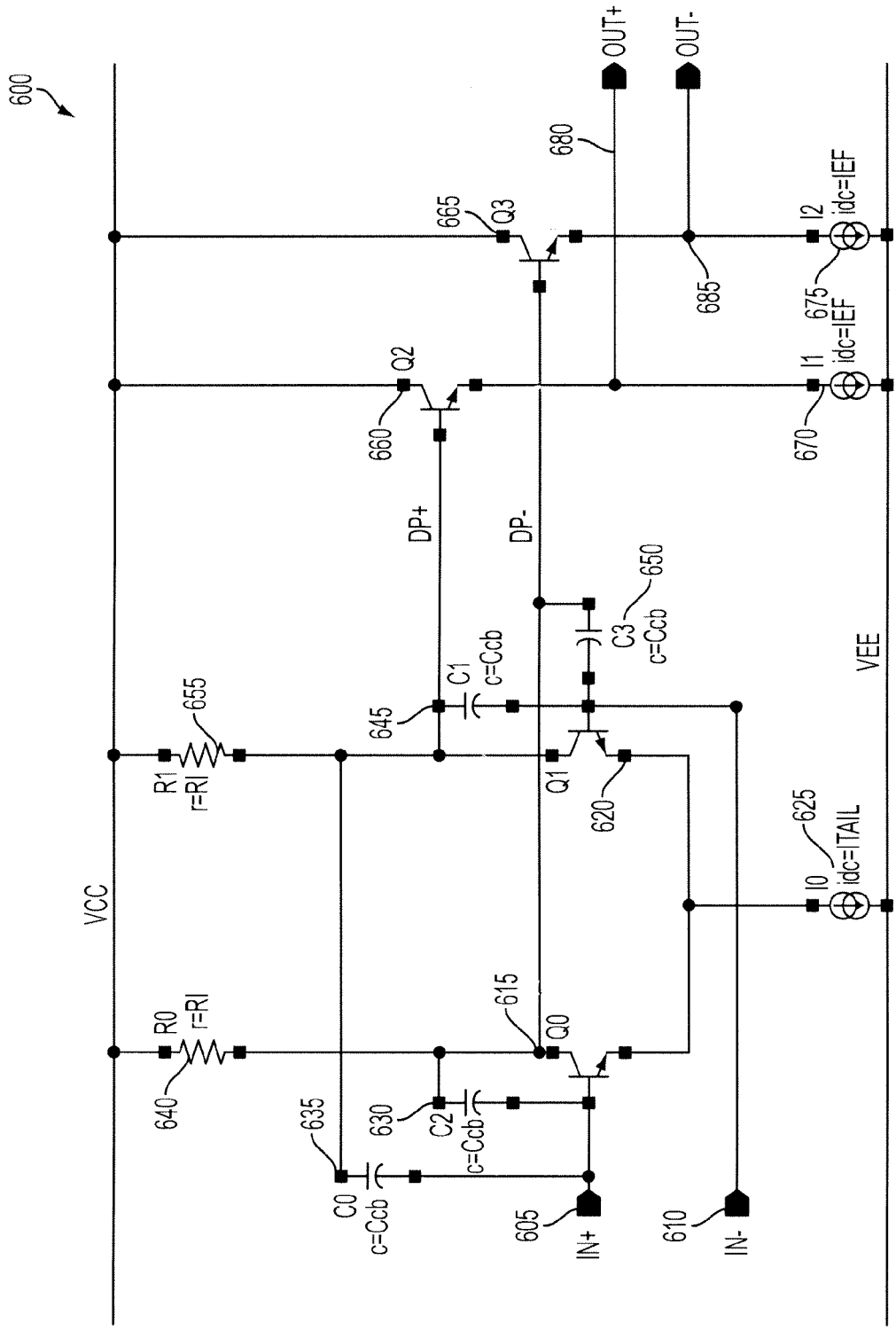

FIGS. 4-6 show different exemplary implementations of a gain stage of a limiting amplifier capable of reducing bandwidth, according to an embodiment of the present teaching. FIG. 4 depicts a circuit 400 that is an improved circuit over circuit 300 as shown in FIG. 3. The circuit 400 comprises a pair of differential bipolar transistors 415 and 420, and a corresponding pair of followers 450, 455, respectively. The differential bipolar transistors receive differential input IN+ 405 and IN− 410 and produce, via their followers output OUT+ 470 and OUT− 475. The emitters of the differential bipolar transistor pair are tied together to a current source 425. The emitters of followers 450 and 455 are connected to separate current sources 460 and 465, respectively. The collector of transistor 415 is connected to a voltage VCC via a resistor 435 and the collector of transistor 420 is connected to the voltage VCC via a resistor 440.

In this improved circuit, two filter capacitors, 430 and 445 are introduced to reduce bandwidth. As illustrated, capacitor 430 connects between the voltage VCC and the collector of transistor 415. In parallel, capacitor 445 connects between the voltage VCC and the collector of transistor 420. The prior art circuit 300, as shown in FIG. 3, has capacitors for reducing bandwidth across the collector and base terminals of each differential transistor. In circuit 400, such filter capacitors are between the voltage VCC and the collector of the respective transistors. The capacitance of capacitors 430 and 445 is chosen to be $C_L$.

FIG. 5 depicts another exemplary gain stage circuit 500 of a limiting amplifier with an improved ability for bandwidth reduction, according to a different embodiment of the present teaching. As can be seen, circuit 500 is constructed in a similar manner as circuit 400 except that two bandwidth reducing filter capacitor, 525 and 530, are now connecting between the base terminals of the respective differential bipolar transistors 515 and 520 and a voltage VEE. Specifically, capacitor 525 is coupled between the base terminal of transistor 515 and VEE and capacitor 530 is coupled between the base terminal of transistor 520 and VEE. Here, VEE can be the ground. Due to the fact that the filter capacitors are added to the base of the differential bipolar transistors, the capacitance of both 525 and 530 may likely need to be very high in order to achieve the same level of bandwidth reduction as what can be achieved using circuit 400. In addition, the configuration shown in FIG. 5 filters only input noise, while circuit 400 can filter both input noise and noise generated by the differential pair circuit.

FIG. 6 depicts another gain stage circuit 600 of a limiting amplifier with an improved ability of bandwidth reduction, according to another embodiment of the present teaching. In circuit 600, while other components (differential bipolar transistors and followers) are similarly connected, the filter capacitors used are different. Specifically, in addition to a capacitor C2 630 coupled at the base-collector junction of transistor 615, another capacitor C0 635 is added connecting from the base of Q0 615 to the collector of Q1 620. Symmetrically, in addition to a capacitor C1 645 coupled at the base-collector junction of transistor 620, another capacitor C3 650 is added connecting from the base of Q1 620 to the collector of Q0 615.

The additional capacitors, C0 635 and C3 650, effectively provide a Miller multiplication, but across a positive gain. When the capacitance of this additional capacitor (635 or 650) is chosen to be the same, say $C_{CB}$, as that of capacitors (630 or 645) across the base-collector nodes of Q0 615 and Q1 620, the combined Miller multiplications cancel each other leaving an approximate effective capacitance of $2 \times C_{CB}$ at each of the base nodes of Q0 615 and Q1 620, and at each of their collector nodes.

The circuit 600 as shown in FIG. 6 achieves performance similar to that of the circuit 400 shown in FIG. 4, when the capacitance of each capacitor, or $C_{CB}$, is chosen to be one-half of the value of $C_L$ (the capacitance of filter capacitors 430 or 445) as used in FIG. 4. The bandwidth limiting performance that is achieved by circuit 600 is slightly superior to that of circuit 400 because circuit 600 also provides an effective capacitance on the bases of Q0 615 and Q1 620.

There is an additional consideration. A limiting amplifier usually needs to operate over a wide range of input slew-rates. When a high slew-rate input is provided, it may be needed to minimize the bandwidth reduction effect intended for the case of a low slew-rate input. In a BiCMOS process, MOSFET devices can be used to switch the filter capacitors in and out. In such applications, however, the MOSFET devices used need to be large to reduce parasitic on-resistance. It is often desired to minimize the number of switches in order to reduce the area needed and the circuit complexity. In light of such considerations, the topology depicted in FIG. 4 may be more suitable when compared with that of circuit 600.

Figure 7:
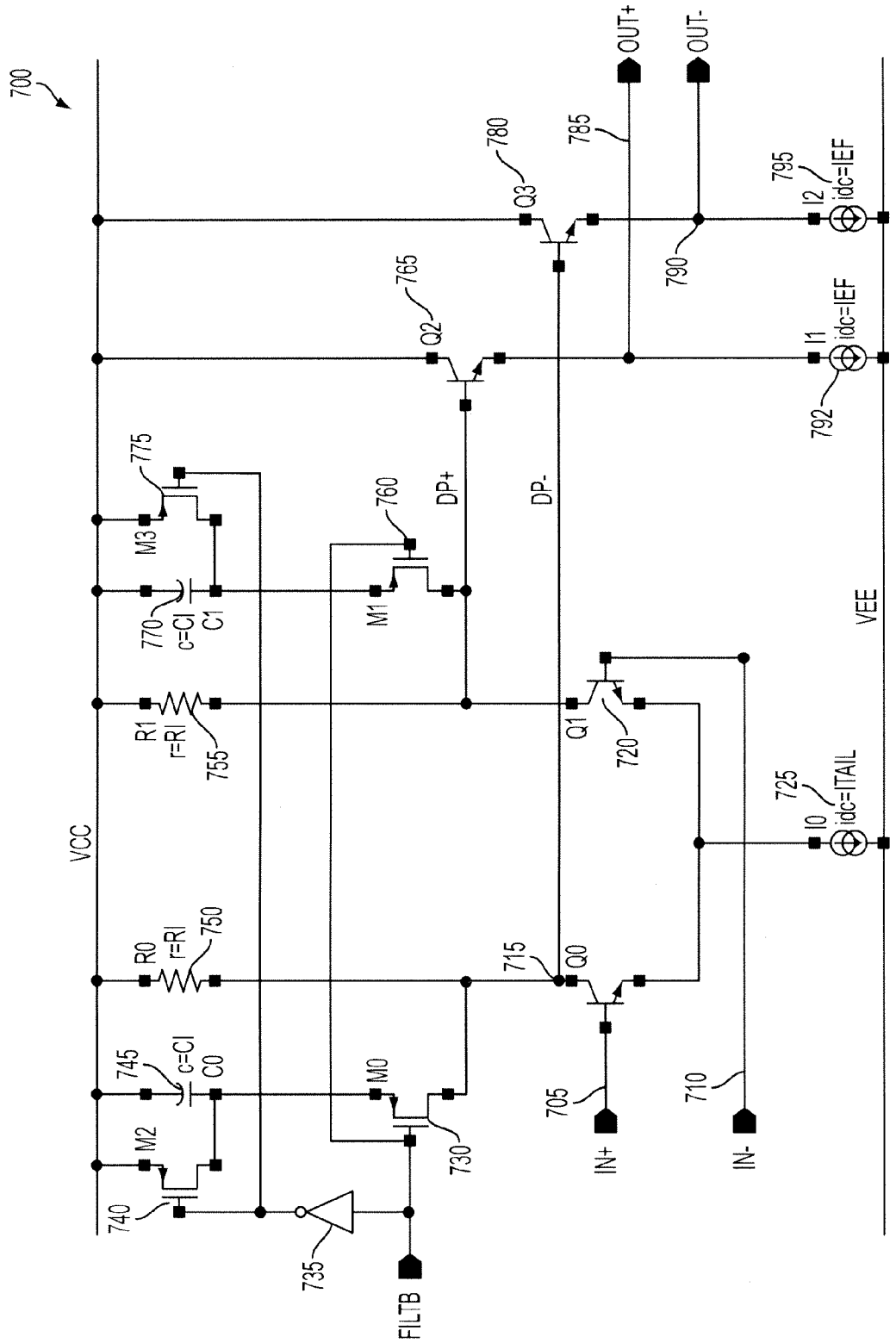
FIG. 7 depicts an exemplary gain stage circuit in a limiting amplifier with phase noise reduction sub-circuitry and bandwidth selection sub-circuitry, according to an embodiment of the present teaching.

FIG. 7 depicts a gain stage circuit 700 of a limiting amplifier with a capability of switching filter capacitors on and off, according to an embodiment of the present teaching. The circuit 700 is constructed based on circuit 400 with additional switches that are used to switch the filter capacitors on and off in accordance with a control signal (FILTB) that dictates the filter bandwidth for that gain stage. As shown, circuit 700 comprises all the components as are in circuit 400 such as differential bipolar transistors 715 and 720, their respective followers 765 and 780, current sources 725, 792, and 795, as well as resistors 750 and 755 connecting the collectors of the transistors 715 and 720 to voltage VCC. Although there are filter capacitors 745 and 770, which couple the respective collectors to voltage VCC, their connections to collectors of transistors 715 and 720 can be turned on and off via switches.

As shown, devices M0 730 and M2 740 serve as a switch with respect to capacitor 745 and devices M1 760 and M3 775 serve as a switch with respect to capacitor 770. Those devices (730, 740, 760, and 775) are controlled by a signal filter bar (FILTB) via an inverter 735. Whenever signal FILTB is high, it turns off devices M0 730 and M1 760. At the same time, the output signal of the inverter 735 provides a low signal which turns on both M2 740 and M3 775. Together, those switches effectively decouple the filter capacitors 745 and 770 from the transistors 715 and 720. Conversely, whenever signal FILTB is low, it turns on devices M0 730 and M1 760 and turns off M2 740 and M3 775, which together connect the filter capacitors 745 and 770 with transistors 715 and 720 so that they serve to reduce the bandwidth.

While devices M0 730 and M1 760 add some parasitic capacitance to the collectors of Q0 715 and Q1 720, even when switched off, this capacitance is relatively small, just $C_{GD}$. A tradeoff can be made to determine the optimal sizing of M0 730 and M1 760 based on the particular application needs and circuit specifics. This is because making these devices very large minimizes on-resistance and making them very small minimizes off-state parasitic capacitance. Note that M2 740 and M3 775 are optional small devices and they may be added so the source nodes of M0 730 and M1 760 do not float and are forced to be VCC.

As discussed herein, circuit 700 is capable of selectively reducing bandwidth based on the state of the controlling signal FILTB. For example, FILTB can be controlled to have a low state when the input slew-rate is below a certain threshold, and have a high state otherwise. In accordance with the present teaching, each gain stage of a limiting amplifier can incorporate such selectable noise filtering capability so that each gain stage of the limiting amplifier has the ability to select a specific bandwidth suitable for that gain stage for reducing broadband noise and hence output phase noise when inputs to the limiting amplifier are known to have a low slew-rate.

In some embodiments, further improvement may be made by modifying circuit 700 to allow selection of more than one circuit bandwidth. This may be achieved by replicating (not shown) the sub-circuit comprising devices M0 730, M1 760, M2 740, M3 775 and filter capacitors 745 and 770 so that each sub-circuit can be independently selected, thereby allowing configuration of different amplifier bandwidths based on the specific input slew rate. In addition, in a limiting amplifier with cascaded stages, different gain stages may need to be optimized to handle different ranges of low slew-rate input signals. Each stage may use the topology as shown in FIG. 7, with or without replicated sub-circuits, to select one or more bandwidths, but each stage is configured to select different bandwidth ranges and corresponding filtering capabilities. For instance, each stage may select different bandwidths and employ filter capacitors of different capacitance values determined, e.g., based on the expected input slew-rate and noise characteristics of that specific stage.

Figure 8:
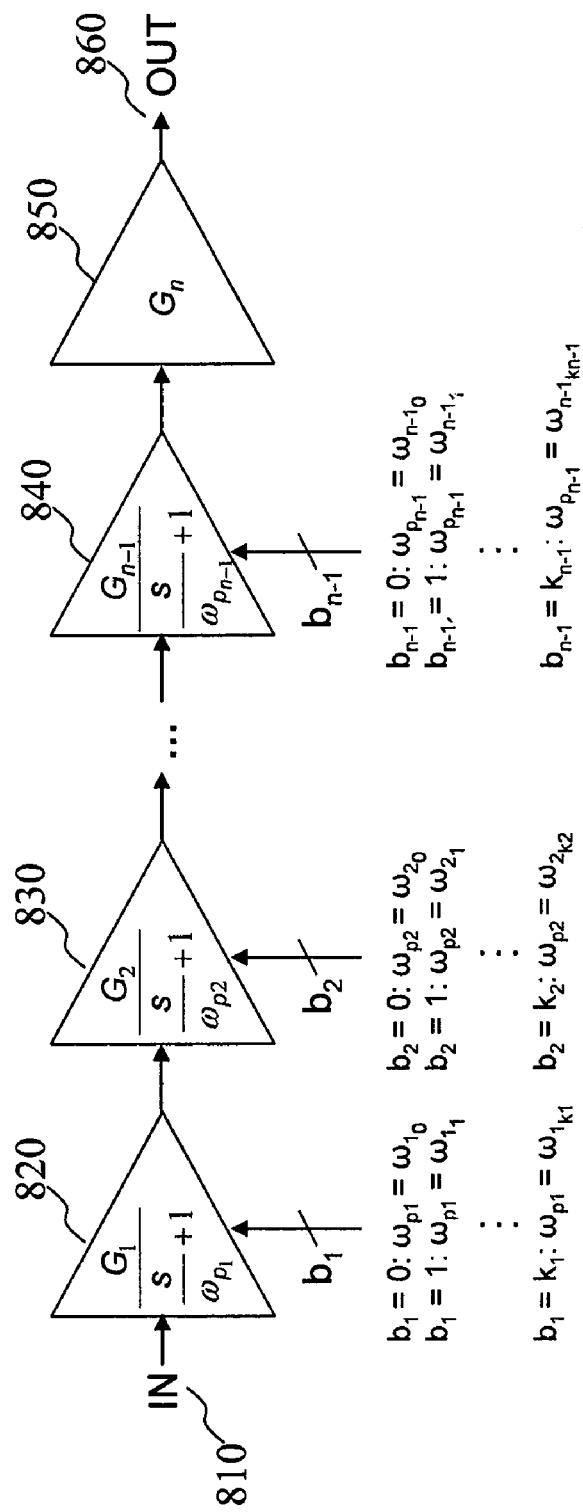
FIG. 8 depicts a limiting amplifier with cascaded gain stages each of which has the ability of bandwidth selection for phase noise reduction, according to an embodiment of the present teaching.

The block diagram in FIG. 8 shows an exemplary implementation of a limiting amplifier having multiple cascaded gain stages, each of which has the ability of bandwidth reduction based on a selected bandwidth, according to an embodiment of the present teaching. In this general form of a limiting amplifier, there are a plurality of cascaded gain stages, 820, 830, . . . , 840, and 850, which takes an input IN 810 and produces an output OUT 860. In this configuration, each of the cascaded gain stages is implemented with a single-pole filter whose cutoff frequency may be selected from a range of values. For example, the first gain stage 820 has the ability of selecting one of $K_1$ cutoff frequencies, the second gain stage 830 has the ability of selecting one of $K_2$ cutoff frequencies, . . . , and the second to last stage can select one of $K_{n-1}$ cutoff frequencies.

In some embodiments, the selection of cutoff frequencies can be achieved by means of bandwidth selectors, shown as $b_1$ through $b_{n-1}$ in FIG. 8. Since each individual gain stage has its own selector, each stage may therefore be customized to reduce the bandwidth based on some expected input slew-rate of that stage. It is worth mentioning that each consecutive stage may limit the bandwidth at a higher frequency, since each consecutive gain stage is to be presented with a higher slew-rate input than its predecessor.

Figure 1:
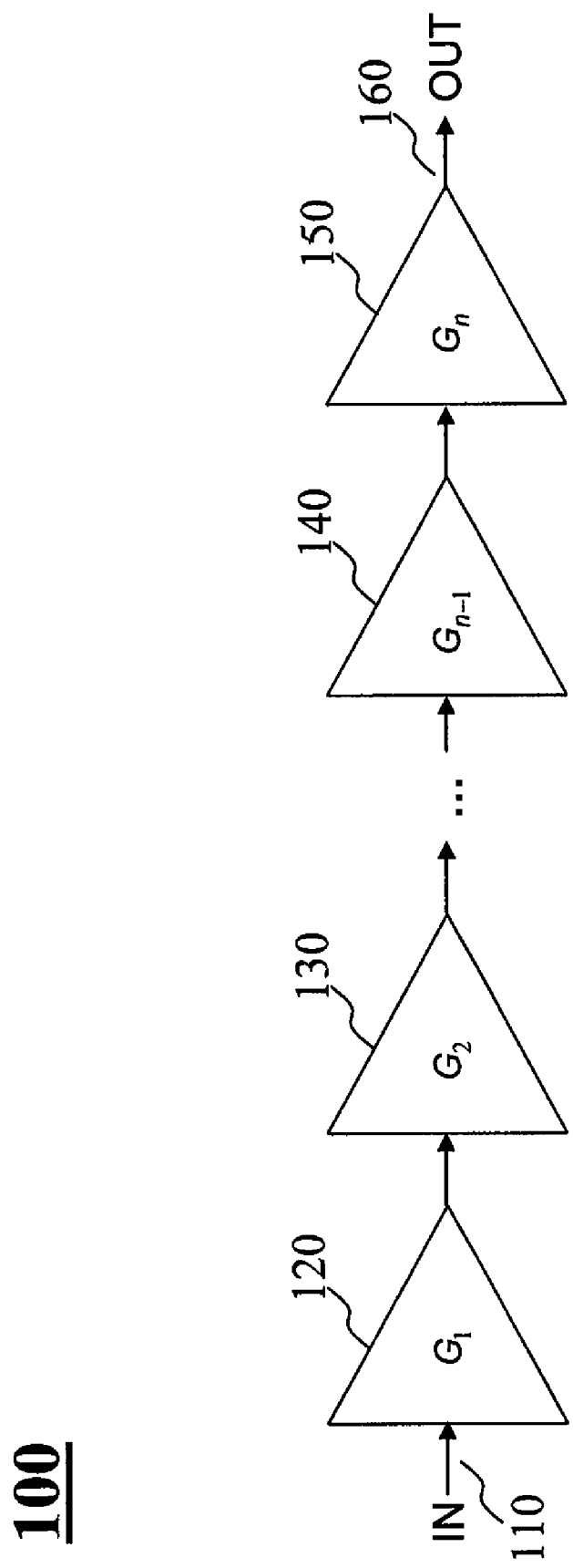
FIG. 1 (Prior Art) shows a limiting amplifier with cascaded gain stages.
Figure 2:
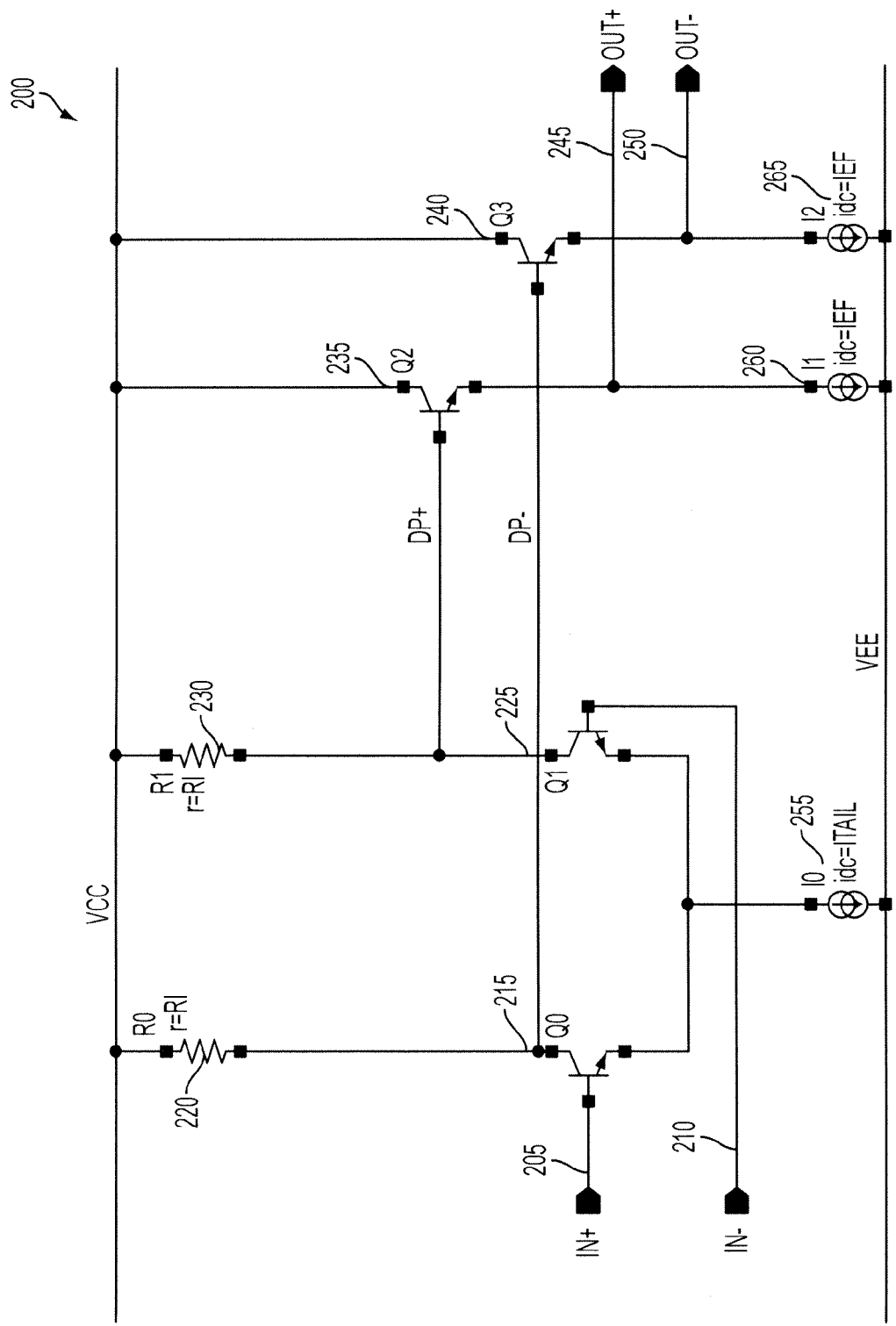
FIG. 2 (Prior Art) shows a circuit of a gain stage of a limiting amplifier.

The difference between the exemplary block diagram of a limiting amplifier with multiple gain stages shown in FIG. 8 as compared with a prior art limiting amplifier with multiple gain stages shown in FIG. 1 is that the bandwidth at each gain stage can not be adjusted based on an input slew-rate. As a consequence, the prior art limiting amplifier usually has a much greater bandwidth than required or desired when presented with a low slew-rate input signal, while the limiting amplifier as shown in FIG. 8 has the ability to optimize the performance of each gain stage by selecting appropriate bandwidth at each stage.

Figure 9:
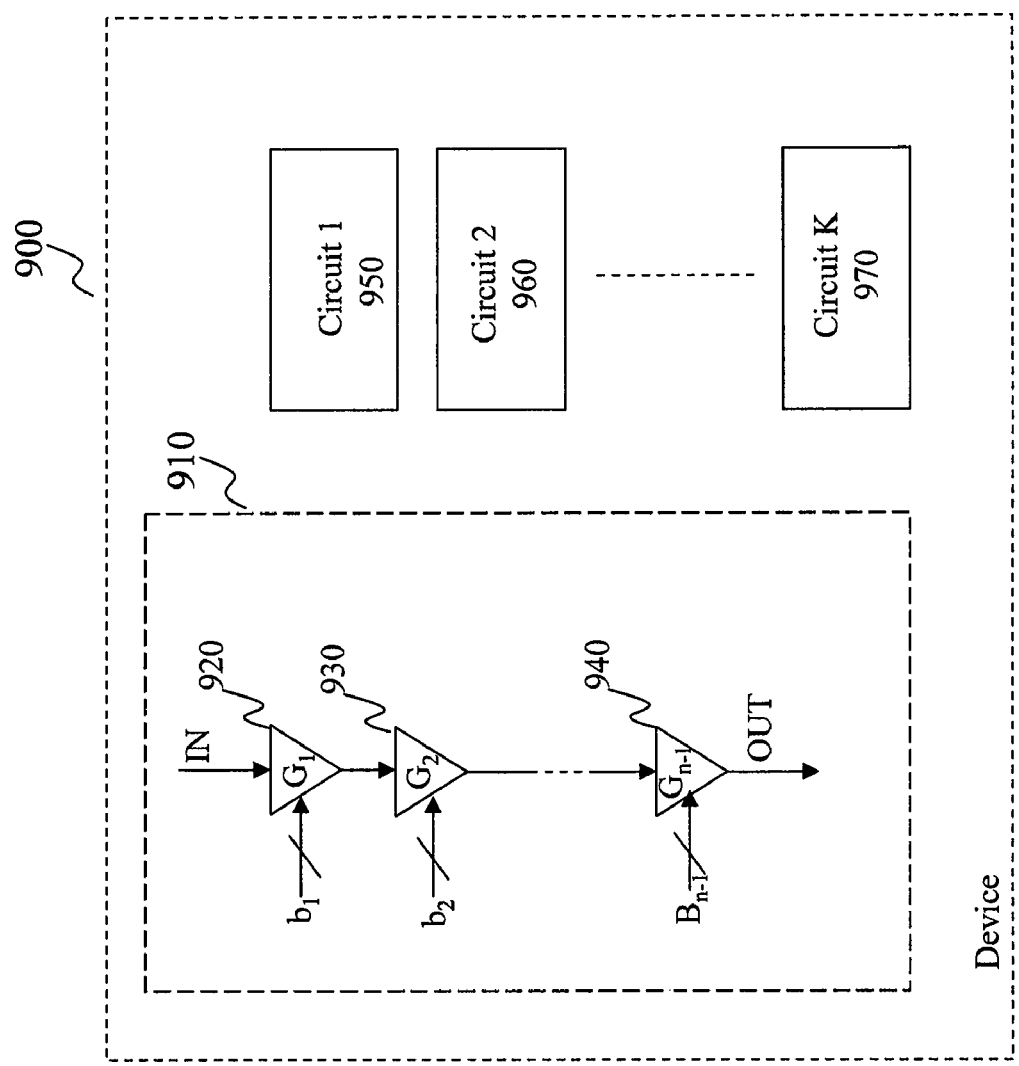
FIG. 9 is an exemplary device incorporating a limiting amplifier capable of bandwidth selection and phase noise reduction in each gain stage, according to an embodiment of the present teaching.

FIG. 9 depicts a device 900 incorporating a limiting amplifier 910 capable of bandwidth selection and phase noise reduction in each gain stage, according to an embodiment of the present teaching. Device 900 includes one or more circuitries, circuit 1 950, circuit 2 960, . . . , circuit K 970. In addition, device 900 also includes a limiting amplifier 910 constructed and functioning in accordance with what is disclosed herein. The limiting amplifier 910 may connect to or be used in any of the circuits 950, . . . , 970 (connection is not shown). The limiting amplifier 910 comprises a series of cascaded gain stages 920, 930, . . . , 940, each of which has the ability of bandwidth reduction based on a selected bandwidth $b_1$, $b_2$, $b_{n-1}$, respectively. The limiting amplifier 910 provides improved performance as to phase noise in a manner as described in the present teaching disclosed herein. In many instances, the limiting amplifier 910 may use MOSFET rather than bipolar transistors. In such cases, the present teaching would be modified so the MOSFET gate terminal would be used instead of the bipolar base terminal, the MOSFET source in place of the bipolar emitter, and the MOSFET drain in place of the bipolar collector. In addition, although an exemplary limiting amplifier 910 is included in device 900 in FIG. 9, more than one such limiting amplifiers may be incorporated in a single device. It is generally understood that any appropriate technologies, whether currently existing or developed in the future, may be employed to implement the teachings disclosed herein.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A limiting amplifier circuit with improved phase noise, comprising:
    an input port;
    an output port; and
    n cascaded gain stage (where n is an integer greater than 1, having an input of a first gain stage connected to the input port, an output of a last gain stage connected to the output port, and an output of each gain stage connected to an input of an adjacent gain stage, wherein
    each gain stage i (where i is an integer) of the n gain stages includes a bandwidth selector for selecting at least one lowpass filter corner frequency $\omega_{p_i}$, and thereby reducing the phase noise of the gain stage through the broadband noise reduction for frequencies greater than $\omega_{p_i}$, and
    $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage.

2. The limiting amplifier circuit of claim 1, wherein each gain stage comprises:
    a differential input pair circuit having first and second transistors with their bases connected to differential positive and negative inputs, respectively, emitters connected to a first current source, and collectors coupled to a first power source via corresponding first and second resistors;
    an output circuit having third and fourth transistors with their emitters connected to second and third current sources, collectors connected to the first power source, and bases to the respective collectors of the first and second transistors;
    at least one bandwidth selection sub-circuitry configured to obtain the lowpass filter corner frequency $\omega_{p_i}$ for the gain stage;
    at least one phase noise reduction sub-circuitry coupled to the differential input pair circuit and the corresponding at least one bandwidth selection sub-circuitry, configured to reduce bandwidth with respect to the corresponding selected lowpass filter corner frequency $\omega_{p_i}$ for the gain stage, wherein
    the emitters of the third and fourth transistors are connected to differential positive and negative outputs, respectively, and
    first, second, and third current sources are connected to a second power source.

3. The limiting amplifier circuit of claim 2, wherein each phase noise reduction sub-circuitry comprises:
    a first capacitor coupled in parallel to the first resistor; and
    a second capacitor coupled in parallel to the second resistor.

4. The limiting amplifier circuit of claim 2, wherein the phase noise reduction sub-circuitry comprises:
    a first capacitor connecting the positive input and the second power source; and
    a second capacitor connecting the negative input and the second power source.

5. The limiting amplifier circuit of claim 2, wherein the phase noise reduction sub-circuitry comprises:
    a first capacitor connecting the base of the first transistor and the collector of the second transistor;
    a second capacitor connecting the base and collector of the first transistor;
    a third capacitor connecting the base of the second transistor and the collector of the first transistor; and
    a fourth capacitor connecting the base and collector of the second transistor.

6. The limiting amplifier circuit of claim 2, wherein each bandwidth selection sub-circuit includes a first set of switches configured to couple or decouple the components implementing the corresponding phase noise reduction sub-circuitry.

7. The limiting amplifier circuit of claim 6, wherein the first set of switches is implemented based on a first pair of PMOS transistors having their drains connected to the collectors of the first and second transistors, gates coupled to a logic signal, and sources coupled to the first power source via a pair of capacitors comprising the phase noise reduction sub-circuitry.

8. The limiting amplifier circuit of claim 7, wherein each bandwidth selection sub-circuit further includes a second set of switches configured for ensuring that all capacitor nodes in the phase noise reduction sub-circuitry are connected to a known voltage when the state of the bandwidth selection sub-circuitry is off.

9. The limiting amplifier circuit of claim 8, wherein the second set of switches is implemented based on a second pair of PMOS transistors having their gates tied together and coupled to an output of an inverter having its input connected to the logic signal, drains connected to the sources of the first pair of PMOS transistors, and sources to the first power source.

10. A limiting amplifier circuit with improved phase noise, comprising:
   an input port;
   an output port; and
   n cascaded gain stage (where n is an integer greater than 1, having an input of a first gain stage connected to the input port, an output of a last gain stage connected to the output port, and an output of each gain stage connected to an input of an adjacent gain stage, wherein
   each gain stage i (where i is an integer)of the n gain stages includes a bandwidth selector for selecting at least one lowpass filter corner frequency $\omega_{p_i}$, and thereby reducing the phase noise of the gain stage through the broadband noise reduction for frequencies greater than $\omega_{p_i}$, and
   $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage and comprises:
   a differential input pair circuit having first and second transistors with their bases connected to differential positive and negative inputs, respectively, emitters connected to a first current source, and collectors coupled to a first power source via corresponding first and second resistors,
   an output circuit having third and fourth transistors with their emitters connected to second and third current sources, collectors connected to the first power source, and bases to the respective collectors of the first and second transistors,
   a first capacitor coupled in parallel to the first resistor,
   a second capacitor coupled in parallel to the second resistor, and
   a first set of switches to couple the first and second capacitors to the first and second resistors, respectively, when the bandwidth reduction sub-circuitry is enabled, and to decouple the first and second capacitors otherwise.

11. A limiting amplifier circuit with improved phase noise, comprising:
   an input port;
   an output port; and
   n cascaded gain stage (where n is an integer greater than 1, having an input of a first gain stage connected to the input port, an output of a last gain stage connected to the output port, and an output of each gain stage connected to an input of an adjacent gain stage, wherein
   each gain stage i (where i is an integer) of the n gain stages includes a bandwidth selector for selecting at least one lowpass filter corner frequency $\omega_{p_i}$, and thereby reducing the phase noise of the gain stage through the broadband noise reduction for frequencies greater than $\omega_{p_i}$, and
   $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage and comprises:
   a differential input pair circuit having first and second transistors with their bases connected to differential positive and negative inputs, respectively, emitters connected to a first current source, and collectors coupled to a first power source via corresponding first and second resistors,
   an output circuit having third and fourth transistors with their emitters connected to second and third current sources, collectors connected to the first power source, and bases to the respective collectors of the first and second transistors,
   a first capacitor connecting the positive input and the second power source, and
   a second capacitor connecting the negative input and the second power source,
   the capacitors being arranged to reduce bandwidth of the gain stage.

12. A limiting amplifier circuit with improved phase noise, comprising:
   an input port;
   an output port; and
   n cascaded gain stage (where n is an integer greater than 1, having an input of a first gain stage connected to the input port, an output of a last gain stage connected to the output port, and an output of each gain stage connected to an input of an adjacent gain stage, wherein
   each gain stage i (where i is an integer) of the n gain stages includes a bandwidth selector for selecting at least one lowpass filter corner frequency $\omega_{p_i}$, and thereby reducing the phase noise of the gain stage through the broadband noise reduction for frequencies greater than $\omega_{p_i}$, and
   $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage and comprises:
   a differential input pair circuit having first and second transistors with their bases connected to differential positive and negative inputs, respectively, emitters connected to a first current source, and collectors coupled to a first power source via corresponding first and second resistors,
   an output circuit having third and fourth transistors with their emitters connected to second and third current sources, collectors connected to the first power source, and bases to the respective collectors of the first and second transistors,
   a first capacitor connecting the base of the first transistor and the collector of the second transistor,
   a second capacitor connecting the base and collector of the first transistor,
   a third capacitor connecting the base of the second transistor and the collector of the first transistor, and
   a fourth capacitor connecting the base and collector of the second transistor,
   the capacitors being arranged to reduce bandwidth of the gain stage.

13. A device incorporating a limiting amplifier circuit with improved phase noise, comprising:
- one or more circuitries configured for performing corresponding one or more functions;
- at least one limiting amplifier, each of which is coupled with at least one of the circuitries, taking an input and producing an output, wherein the limiting amplifier comprises:
- an input port,
- an output port, and
- n cascaded gain stage (where n is an integer greater than 1, having an input of a first gain stage connected to the input port, an output of a last gain stage connected to the output port, and an output of each gain stage connected to an input of an adjacent gain stage, wherein
- each gain stage i (where i is an integer) of the n gain stages includes a bandwidth selector for selecting at least one lowpass filter corner frequency $\omega_{p_i}$, and thereby reducing the phase noise of the gain stage through the broadband noise reduction for frequencies greater than $\omega_{p_i}$, and
- $\omega_{p_i}$ is selected from a plurality of values associated with the gain stage to optimize the phase noise of the limiting amplifier by trading off reducing the broadband noise of the gain stage versus maintaining a sufficient output slew-rate of the gain stage.

\* \* \* \* \*

UNITED STATES PATENT AND TRADEMARK OFFICE
CERTIFICATE OF CORRECTION

PATENT NO. : 8,319,551 B2  
APPLICATION NO. : 12/913293  
DATED : November 27, 2012  
INVENTOR(S) : Leslie Catherine Muscha It is certified that error appears in the above-identified patent and that said Letters Patent is hereby corrected as shown below:

IN THE CLAIMS

Claim 1, Column 9, Line 63, please delete "(where n is an integer greater than 1," and insert --(where n is an integer greater than 1),--.

Claim 10, Column 11, Line 22, please delete "(where n is an integer greater than 1," and insert --(where n is an integer greater than 1),--.

Claim 11, Column 11, Line 60, please delete "(where n is an integer greater than 1," and insert --(where n is an integer greater than 1),--.

Claim 12, Column 12, Line 31, please delete "(where n is an integer greater than 1," and insert --(where n is an integer greater than 1),--.

Claim 13, Column 13, Line 12, please delete "(where n is an integer greater than 1," and insert --(where n is an integer greater than 1),--.

Signed and Sealed this  
Twenty-first Day of October, 2014

Michelle K. Lee  
*Deputy Director of the United States Patent and Trademark Office*